(12) United States Patent
Saha

(10) Patent No.: US 10,267,828 B2
(45) Date of Patent: *Apr. 23, 2019

(54) APPARATUS WITH DEVICE WITH FAULT DETECTION PROTECTION

(71) Applicant: STMICROELECTRONICS (RESEARCH & DEVELOPMENT) LIMITED, Marlow (GB)

(72) Inventor: Shatabda Saha, Edinburgh (GB)

(73) Assignee: STMICROELECTRONICS (RESEARCH & DEVELOPMENT) LIMITED, Marlow Bucks (GB)

( * ) Notice: Subject to any disclaimer, the term of this patent is extended or adjusted under 35 U.S.C. 154(b) by 0 days.

This patent is subject to a terminal disclaimer.

(21) Appl. No.: 15/628,248

(22) Filed: Jun. 20, 2017

(65) Prior Publication Data

US 2017/0285078 A1 Oct. 5, 2017

Related U.S. Application Data

(62) Division of application No. 14/838,447, filed on Aug. 28, 2015, now Pat. No. 9,753,060.

(51) Int. Cl.
| G01R 17/02 | (2006.01) |
| H01S 5/042 | (2006.01) |
| G01C 3/02 | (2006.01) |
| H01S 5/068 | (2006.01) |
| G01S 17/10 | (2006.01) |
| G01S 7/484 | (2006.01) |
| G01S 7/497 | (2006.01) |
| H01S 5/183 | (2006.01) |

(52) U.S. Cl.
CPC .............. *G01R 17/02* (2013.01); *G01C 3/02* (2013.01); *G01S 7/484* (2013.01); *G01S 7/497* (2013.01); *G01S 17/10* (2013.01); *H01S 5/06825* (2013.01); *H01S 5/0428* (2013.01); *H01S 5/183* (2013.01)

(58) Field of Classification Search
CPC ....... G01R 17/02; G01C 3/02; H01S 5/06825; H01S 5/0428; H01S 5/183; G01S 7/4916; G01S 7/493
See application file for complete search history.

(56) References Cited

U.S. PATENT DOCUMENTS

| 4,709,370 | A | | 11/1987 | Bednarz et al. |
| 4,856,011 | A | | 8/1989 | Shimada et al. |
| 5,163,063 | A | | 11/1992 | Yoshikawa et al. |
| 5,359,433 | A | * | 10/1994 | Nagase ................ H04N 1/4056 358/3.01 |
| 5,511,087 | A | | 4/1996 | Sato et al. |
| 5,708,673 | A | | 1/1998 | Ikeuchi |
| 5,932,861 | A | | 8/1999 | Iwaguchi et al. |
| 9,753,060 | B2 | * | 9/2017 | Saha ....................... G01C 3/02 |
| 2006/0255238 | A1 | | 11/2006 | Lee |

(Continued)

*Primary Examiner* — Sang H Nguyen
(74) *Attorney, Agent, or Firm* — Slater Matsil, LLP

(57) ABSTRACT

A device such as a laser diode is provided with a monitoring arrangement. The monitoring arrangement has voltage to current converters arranged to provide respectively currents which are proportional to the respective voltages on an anode and on a cathode of the laser diode. The monitoring arrangement provides a first output signal when the laser diode is on too long. That output signal is used to cause the laser diode to be switched off.

17 Claims, 9 Drawing Sheets

(56) References Cited

U.S. PATENT DOCUMENTS

| | | |
|---|---|---|
| 2010/0172385 A1 | 7/2010 | Groepl et al. |
| 2011/0228254 A1* | 9/2011 | Ueno .................... G01S 17/325 356/5.09 |
| 2012/0010858 A1* | 1/2012 | Ueno .................... G01S 7/4916 702/189 |

* cited by examiner

APPARATUS WITH DEVICE WITH FAULT DETECTION PROTECTION

CROSS-REFERENCE TO RELATED APPLICATIONS

This application is a divisional of U.S. patent application Ser. No. 14/838,447, filed on Aug. 28, 2015, and entitled "Apparatus with Device with Fault Detection Protection," which application is hereby incorporated herein by reference.

TECHNICAL FIELD

The present invention relates to an apparatus which has a device such as a laser diode which is to be monitored. The apparatus may be a ranging apparatus.

BACKGROUND

Devices such as laser diodes are used in various different applications. Many applications require the laser diode to be on for a relatively short period of time. If a device such as a laser diode is on for a prolonged length of time, due to a fault, there may be a risk that safety is compromised. For example, such devices are often used in consumer products such as mobile phones. Safety may be a particular concern in such devices. Alternatively or additionally the problem may be that if a device is on when it should be off, excess power is consumed. This may be disadvantageous in situations where power is provided, for example, by a battery.

SUMMARY

In some embodiments, an apparatus may comprise: a device configured to be switched on and off; a comparing arrangement configured to provide a first output when said device is switched on; and a monitoring arrangement configured to determine when said device has been on too long and in response to said determination to provide a control signal to cause said device to be switched off.

The comparing arrangement may comprise a first voltage to current circuit configured to provide a first current dependent on a voltage at a first node of said device and a second voltage to current circuit configured to provide a second current dependent on a voltage at a second node of said device.

The comparing arrangement may further comprise a comparator configured to be responsive to said first and second currents and to provide said first output when one of said first and second currents is higher than the other.

The comparator may be configured to provide a different output when the other of the said first and second currents is higher than the said one current.

The comparator may comprise a first transistor configured to be responsive to said first current, a second transistor configured to be responsive to said second current and a node between said first and second transistors configured to provide said first output.

The first and second transistors of said comparator may be configured as current sources.

The voltage to current converters may each comprise a transistor arranged in a mirrored arrangement with a respective one of said first and second transistors such that the respective first and second currents are upwardly scaled.

The comparing arrangement may be such that said second current is substantially the same when the device is on and when said device is off.

The comparing arrangement may be arranged such that the first current is substantially off when said device is off and on when said device is on.

The apparatus may further comprise a driver configured to drive said device, said control signal being provided to a control arrangement of said driver.

The apparatus may further comprise a switch for controlling the switching on and off of said device, said control signal causing said switch to switch off said device.

The apparatus may further comprise a clamp switch arranged across said device, said clamp switch when on is configured to cause first and second nodes on either side of said device to be at substantially the same voltage to cause said device to be off, said control signal causing said clamp switch to be on.

The device may comprise a laser diode.

In another embodiment, there is provided a ranging device comprising: a light source configured to be switched on and off so as to emit a pulse of light; a detector configured to detect said emitted pulse of light when said pulse of light has been reflected from an object; a distance determination arrangement configured to determine in dependence on an output from said detector the distance of said object from said ranging device; a comparing arrangement configured to provide at an output a first output signal when said light source is switched on; and a monitoring arrangement configured to receive said first output signal from said output of said comparing arrangement and to determine when said light source has been on too long and in response to said determination to provide a control signal to cause said light source to be switched off.

BRIEF DESCRIPTION OF THE DRAWINGS

Embodiments will now be described by way of example to the accompanying drawings in which.

DETAILED DESCRIPTION

Figure 1:
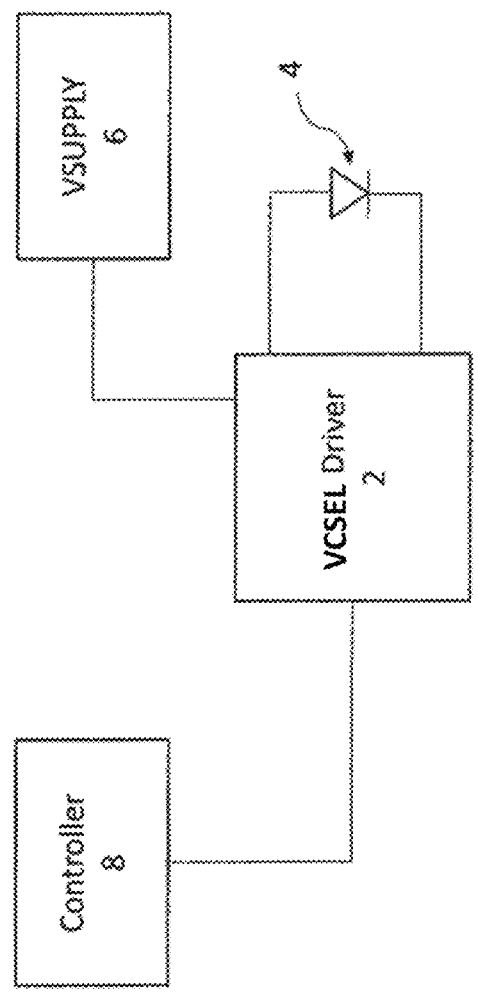
FIG. 1 schematically shows a laser diode and associated control circuitry.

Reference is made to FIG. 1 which schematically shows a laser diode 4. In this example, the laser diode is a vertical-cavity surface-emitting laser (VCSEL). The laser diode 4 is controlled by a driver 2. The driver 2 may receive control signals from a controller 8. The control signal provided by the controller 8 to the driver 2 is configured to cause the driver to drive the laser diode, switching it on and off. When the laser diode 4 is on, the anode of the laser diode is connected to the voltage supply 6. When the laser diode is on, the laser diode will emit light.

Figure 7:
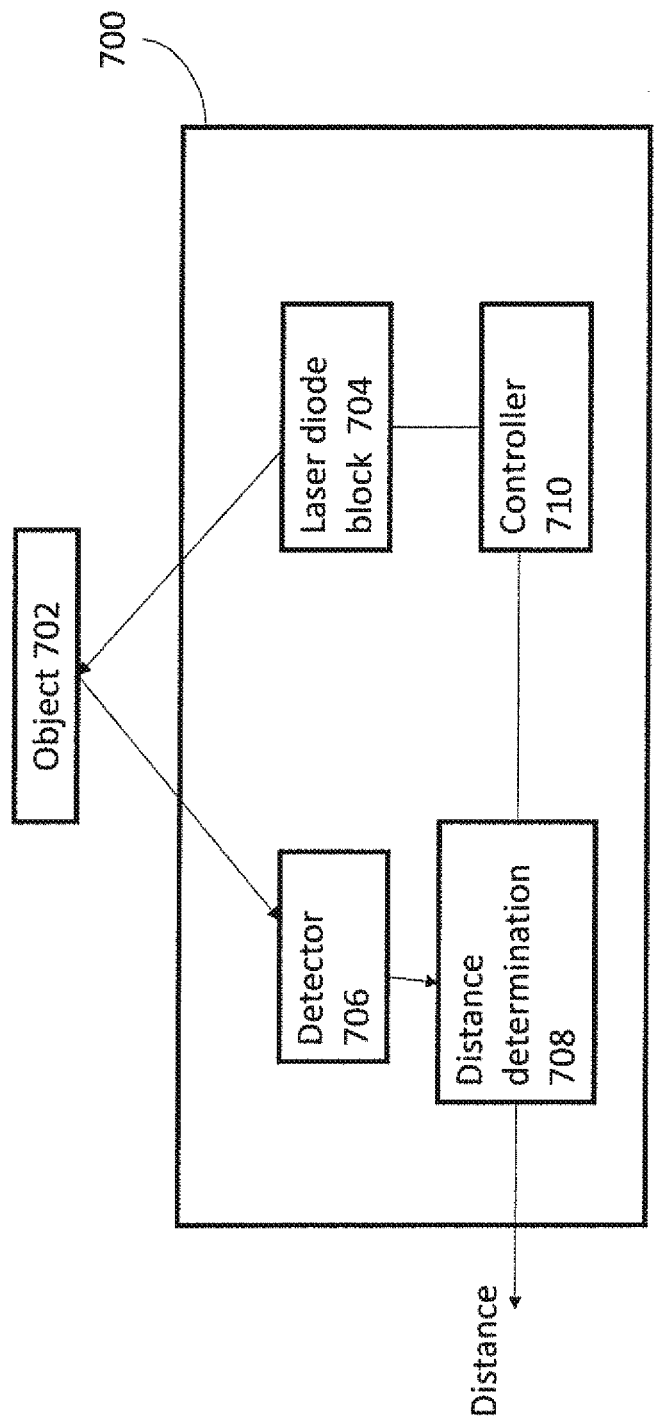
FIG. 7 shows a ranging device in which some embodiments may be provided.

Reference is made to FIG. 7 which schematically shows a ranging apparatus 700 which uses a laser diode in order to determine how far away an object 702 is from the ranging apparatus. Light is emitted from the laser diode block 704, which includes the laser diode and the driver. The laser diode is controlled by the controller 710 to emit a pulse of light. The light pulse emitted by the laser diode will reflect off the object back to a light sensitive detector 706. The light sensitive detector is able to detect the reflected pulse of light. The output of the detector is provided to a distance determination block 708 which may also receive information from the controller relating to the timing of the switching on of the laser diode. This allows the distance of the object 702 from the apparatus 700 to be determined by the distance determination block 708. There are a number of techniques which are known and which allow a determination of the distance to be made. The principles of such techniques rely on the time take for the light pulse emitted by the laser diode to be received at the detector 706 after reflection from the object in question.

In embodiments, the laser diode is typically pulsed on and off, or switched on for relatively short periods of time.

Figure 2A:
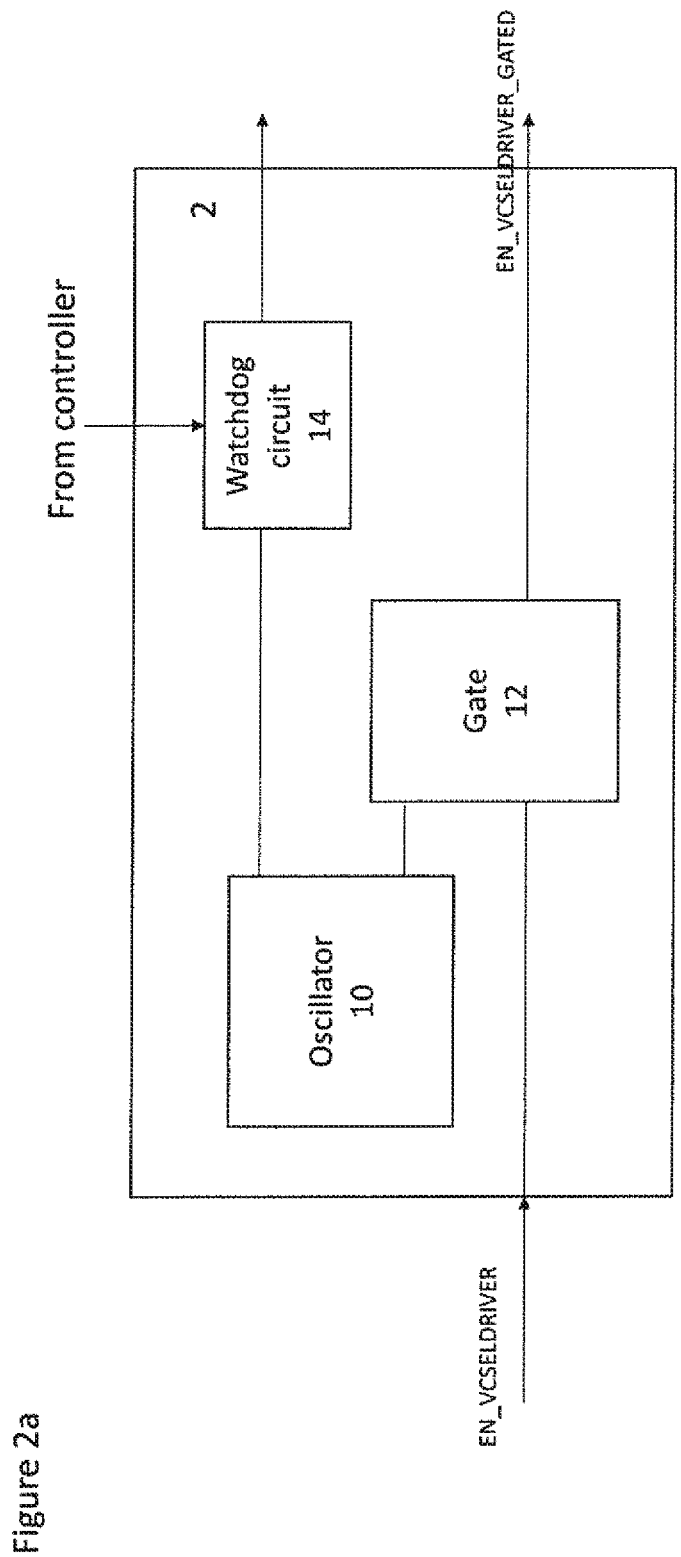
FIG. 2a shows the driver of FIG. 1 in more detail, showing a watchdog circuit.
Figure 4:
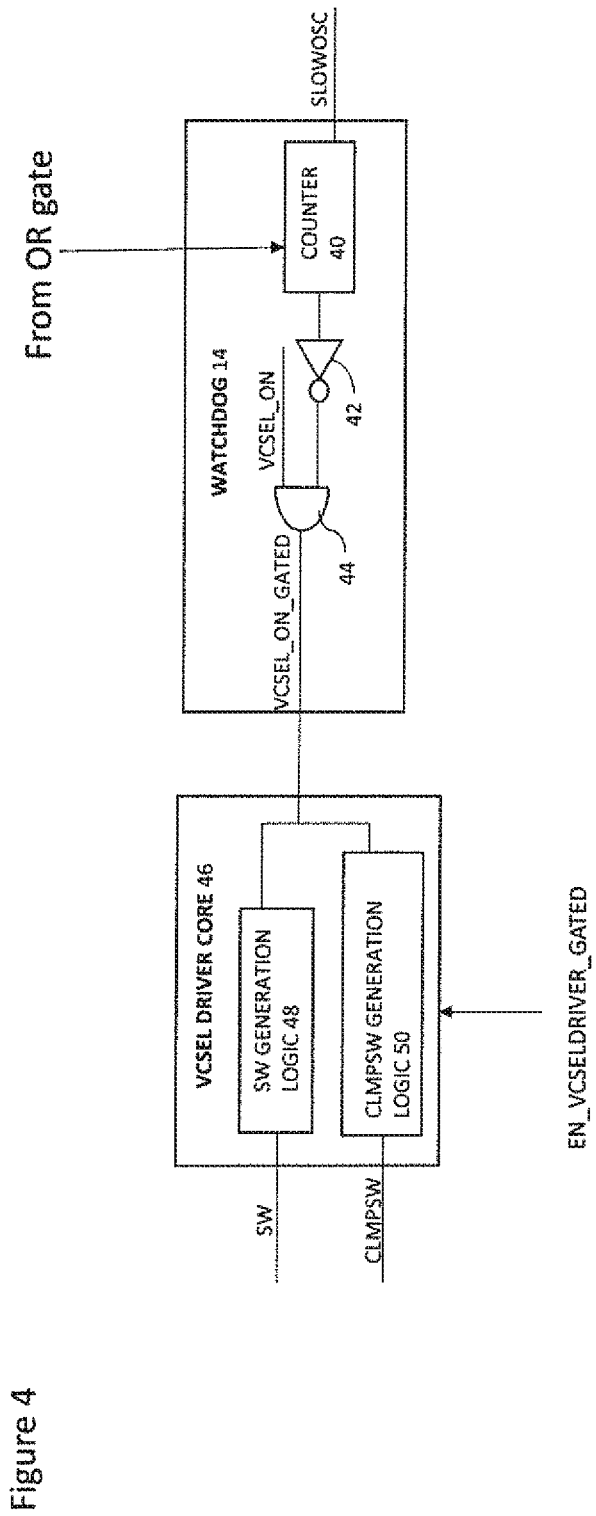
FIG. 4 shows a watchdog circuit and driver core arrangement according to an embodiment.

Reference is made to FIGS. 2a and b which show part of the driver 2 in more detail. Referring first to FIG. 2a, the driver has an oscillator 10 which provides a clock signal as an input to a gate or gate arrangement 12 and a watch dog circuit 14. A gate arrangement may have two or more gates in some embodiments. The gate or gate arrangement 12 is configured to receive an enable signal EN_VCSELDRIVER which will enable the driver. When the driver is enabled, this will allow the driver to drive the diode. The gate or gate arrangement is such that the enable signal and the clock signal cause the gate or gate arrangement to provide an output EN_VCSELDRIVER_GATED. This output allows the enable signal to propagate to a driver core of the driver only when the oscillator output is active. This is shown in FIG. 4. This signal and the control signal from the controller causes the switching on and off of the laser diode on. When the enable signal is active, responsive to the control signal from the controller the switching on and off of the laser diode can be controlled. When the enable signal is inactive the driver circuit is off and the laser diode cannot be switched on.

The watchdog circuit 14 is configured to receive the output of the controller 8 along with the oscillator signal. The watch dog circuit is used for example before a ranging operation to check if the laser diode is stuck on. If a laser diode is stuck on due to the control signal from the controller being on continuously, that can have safety implications particularly where the laser diode is used in a consumer product. The watchdog circuit will output a fail signal if the control signal is high for more than a threshold number of clock signals. This will cause the driver to be switched off, in some embodiments.

Figure 2B:
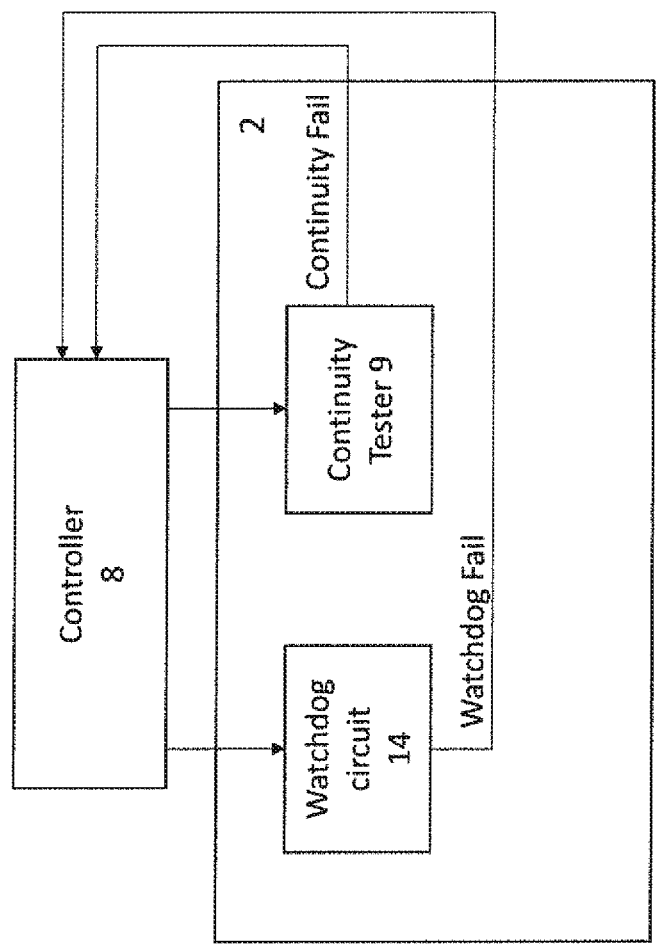
FIG. 2b shows the driver of FIG. 1 in more detail, showing a continuity tester.

Continuity checks have been suggested to check if there is any fault in the output stage of the driver that can potentially cause the laser diode to go unsafe. In this regard reference is made to FIG. 2b which shows a continuity tester 9 in the driver which receives control signals from the controller and outputs a signal if a fail is detected to the controller 8. The watchdog circuit as discussed in relation to FIG. 2a is also shown.

The continuity tester is arranged to check the integrity of the devices that can cause a fault in the output stage of the driver and may cause a potential safety issue. During a continuity test cycle a train of known signals are passed on to the continuity tester 9. These signals emulate the failure conditions and check for the status of the respective fail flags that should be triggered. The controller 8 thus checks for the respective fail flag corresponding the respective fail condition. Once the fail flags match their respective fail conditions the controller assigns a pass flag and allows the driver to continue ranging. In case of a fail the controller shuts down the driver. The continuity checks are carried out only at the beginning of a ranging operation. Accordingly, the previous proposals did not have any monitoring during the ranging period. Accordingly, dynamic faults which arise during the ranging period would not be detected until the next ranging operation. To avoid such problems, the length of the ranging operation were sometimes limited. This can be undesirable in some scenarios.

Figure 3:
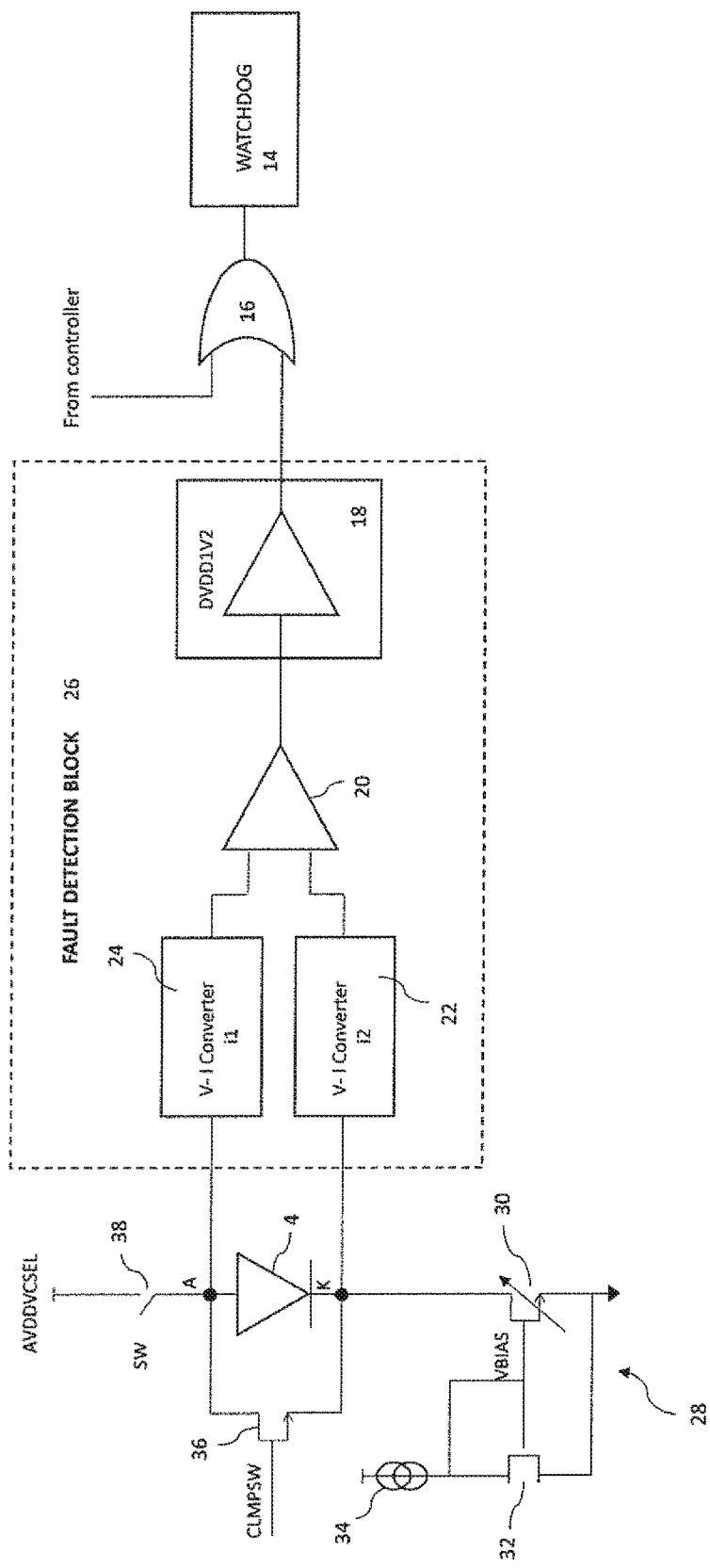
FIG. 3 shows a fault detection arrangement according to an embodiment.

Reference is made to FIG. 3 which shows a fault detection block according to an embodiment. This fault detection block may be provided in the driver block in some embodiments, or externally thereto in other embodiments. This arrangement is such as to allow the fault detection block to be active even during a ranging operation. This may mean that a longer ranging time can be tolerated between continuity checks or may even allow the continuity tester to be omitted.

The laser diode 4 has an anode A which is connected to the voltage supply. A switch 38 is provided. When the switch 38 is closed, the anode of the laser diode is connected to the voltage supply.

A clamp switch 36 is provided across the laser diode. The clamp switch 36, in this embodiment, is in the form of a NMOS transistor. When the laser diode is to be on, the clamp switch 36 is off. When the laser diode is to be off, the clamp switch is on.

Circuitry 28 is provided which is connected to the cathode K of the laser diode. A current source 34 is provided. The current source provides current to the NMOS transistor 32, the other end of which is coupled to ground. This sets the bias voltage for the NMOS transistor 30. The gate of the NMOS transistor 32 is coupled to the gate of the NMOS transistor 30. One end of the channel of the further NMOS transistor 30 is coupled to the cathode K of the laser diode, the other end being coupled to ground. The circuitry 28 is configured to hold the voltage of the cathode of the laser diode at a low voltage level, e.g. at ground or close thereto.

The anode A is coupled to a first voltage to current converter 24 whilst the cathode K is coupled to a second voltage to current converter 22. The first voltage to current converter 24 provides a first current i1 whilst the second voltage to current converter 22 provides a second current i2. The currents provided by the respective converters are input to a comparator 20. Thus, the anode and cathode voltages are sensed and converted by the respective voltage to current converter into respective proportional currents. The comparator 20 is configured to provide a high output if i1 is greater than i2 and is configured to provide a low output if i1 is less than i2. The output of the comparator is configured to be provided to the input of a buffer 18.

The output of the buffer 18 is input to an OR gate 16. The other input to the OR gate is provided by the output from the controller. Thus, when the driver pulses the anode, by closing and opening the switch 38, the voltage at the anode approaches the supply voltage and i1 is greater than i2. The comparator output thus goes high.

When the switch 38 is opened, the anode is clamped to ground through the clamp switch 36, which is closed. The clamp switch is open when the switch 38 is closed. The voltage to current converters are configured such that i1 will be less than i2, in this condition.

A fault will occur when the anode gets stuck high. The laser diode instead of pulsing is on continuously. This may be as a result of a short between the anode and the supply voltage, for example. The output of the comparator gets stuck high and is input to the watchdog circuit. The watchdog circuit will detect that the anode is stuck high, indicating that the laser diode is stuck on, and cause the driver to be powered down. This will now be described in more detail.

Reference is made to FIG. 4 which shows in more detail a driver core 46 of the driver and the watchdog circuit 14, also in the driver. The watchdog circuit has a counter 40, the output of which is input via an inverter to an AND gate 44. The counter receives as an input the output of the OR gate 16 and an input from the oscillator 10. The output of the oscillator provides a clock signal. The counter determines if the output of the OR gate is high for more than a threshold number of counts. If the output of the OR gate is high for more than a threshold number of counts, this indicates that the laser diode is stuck on and/or the control signal from the controller is stuck high. In response to this condition, the output of the counter is high. The input to the AND gate 44 is thus low.

The AND gate also receives an input from the driver signal provided by the controller 8 which activates the driver. When the driver is activated and the counter output indicates that the laser diode is stuck on, the output of the AND gate and hence the watchdog circuit is low.

The low output is used to control the software generation logic 48 block and the clamp switch software generation logic 50 of the driver core 46. In particular, the clamp switch software generation logic 50 is configured to provide an output which is configured to turn the clamp switch on to clamp the anode to ground. The software generation block 48 is configured to control the switch 38 which couples the anode to the supply voltage so as to be open. Either of these actions will cause the laser diode to be switched off.

It should be appreciated that in normal operation, the threshold number of counts is not reached by the counter which provides via the inverter a high input to the AND gate, thus ensuring that the watchdog circuit does not trigger the driver core to cause the switch 38 to the anode to be switched off and the clamp switch to be switched on. The normal output of the counter is low which means the output of the inverter is high. Hence the AND gate 44 propagates the signal from the controller.

Figure 6:
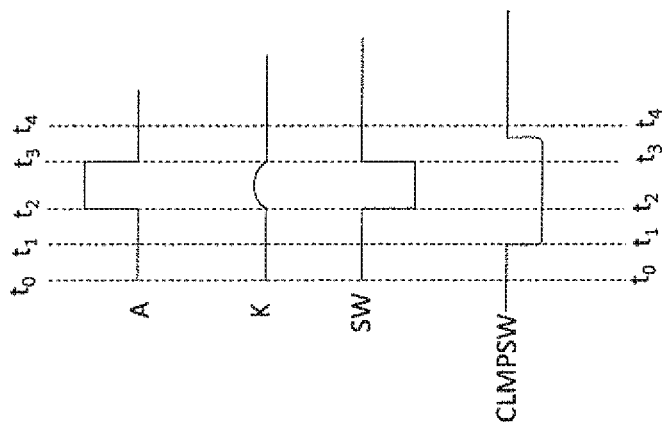
FIG. 6 shows the timing of some signals in the embodiment of FIG. 3.

Reference is made to FIG. 6 which shows timing according to an embodiment. This shows the signals at the anode A, the cathode K, and the signals applied to the switch 38 and the clamp switch.

At time $t_0$, the clamp switch is on (the clamp switch is a NMOS transistor so the voltage applied to the gate of the clamp switch is high), the voltage at the anode A is low, the voltage at the cathode is low and the switch 38 is off (in this example the switch is a PMOS so a high input to the gate keeps the switch off).

At time $t_1$, the clamp switch is turned off, with the other signals being unchanged.

At time $t_2$, the switch 38 is switched on (by applying a low voltage to the gate of that switch) and the clamp switch is still off. The voltage at the anode rises to allow the laser diode to be on. The voltage at the cathode also rises slightly but there is still a sufficient voltage differential between the anode and cathode to cause the laser diode to emit a pulse of light.

At time $t_3$, the switch 38 is switched off (by applying a high voltage to the gate of that switch). The clamp switch also starts to be turned on. The voltage at the anode and cathode drop back to the low level.

At time $t_4$, the clamp switch is fully on.

Figure 5:
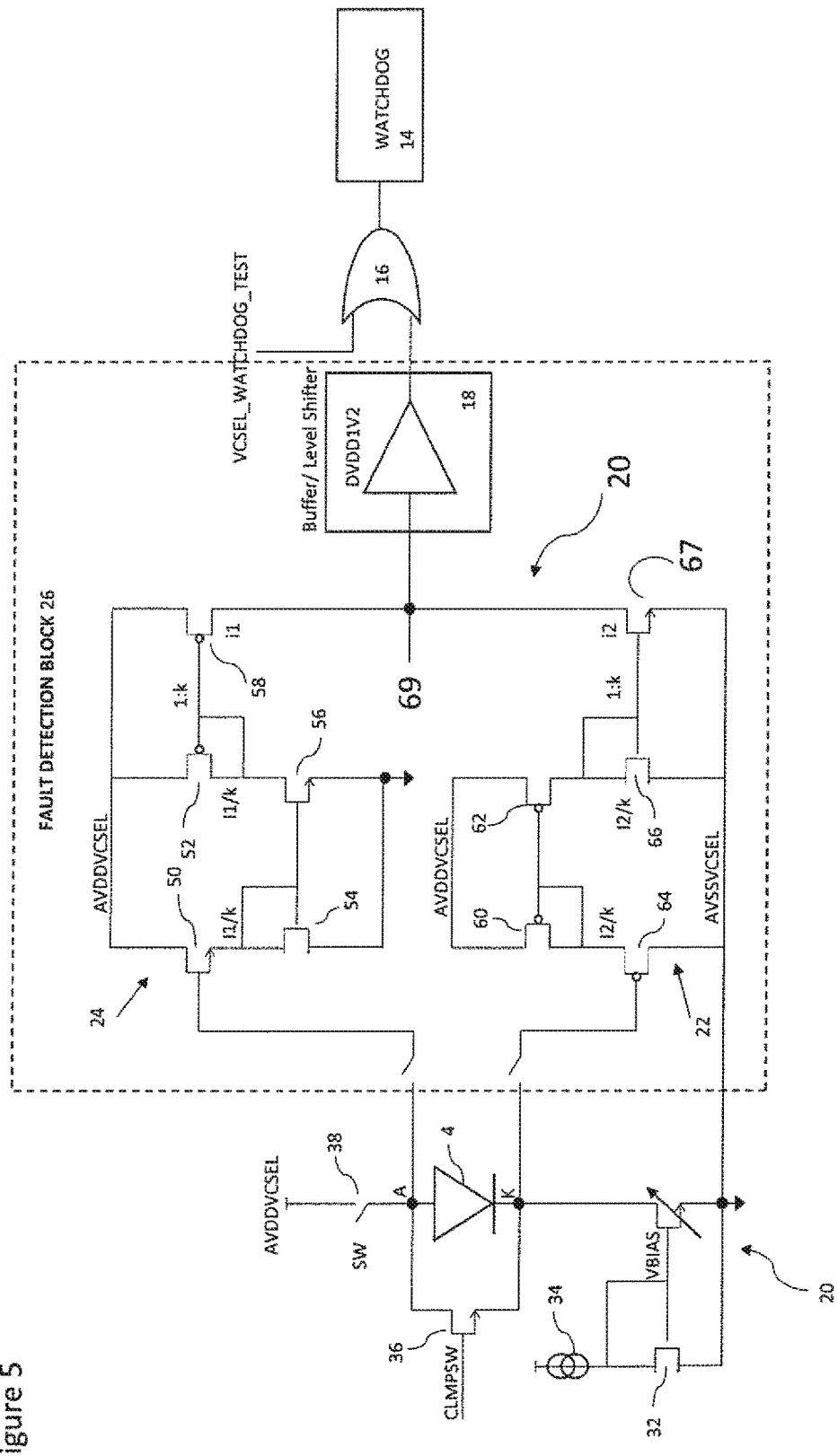
FIG. 5 shows circuitry of one embodiment for providing a fault detection bock as shown in FIG. 3.

Reference is made to FIG. 5 which shows one embodiment for implementing the voltage to current converters and the comparator. The first voltage to current converter comprises first to fourth transistors. The first transistor 50 is an NMOS transistor arranged with its gate coupled to the anode of the diode. One end of the channel is coupled to a voltage supply whilst the other end is coupled to one end of the second NMOS transistor 54 as well as to the gate of the second transistor and the third NMOS transistor 56. The second and third transistors are arranged in a mirrored arrangement with one end of their respective channels being coupled to ground. The other end of the channel of the third transistor 56 is coupled to the gates of the fourth PMOS transistors 52 and a first PMOS transistor 58 of the comparator are provided in a mirrored arrangement. The fourth PMOS transistor and the first PMOS transistor of the comparator have one end of their respective channels coupled to the voltage supply. The other end of the channel of the fourth transistor is coupled to the other end of the third transistor. The other end of the channel of the first PMOS transistor 58 of the comparator provides the output current i1 and is coupled to an output node 69.

The second voltage to current converter 22 comprises first to fourth transistors. The first transistor 64 is a PMOS transistor arranged with its gate coupled to the cathode of the diode. One end of the channel is coupled to ground whilst the other end is coupled to one end of the second PMOS transistor 60 as well as to the gate of the second transistor and the third PMOS transistor 60. The second and third transistors are arranged in a mirrored arrangement with one end of their respective channels being coupled to the voltage supply. The other end of the channel of the third transistor 62 is coupled to the gates of the fourth NMOS transistors 66 and a second NMOS transistor 67 of the comparator are provided in a mirrored arrangement. The fourth NMOS transistor and the second NMOS transistor 67 of the comparator have one end of their respective channels coupled to ground. The other end of the channel of the fourth transistor is coupled to the other end of the third transistor. The other end of the channel of the second NMOS transistor 67 of the comparator provides the output current i2 and is coupled to the output node 69.

It should be appreciated that transistors 54 and 56 provide a current mirror as do transistors 52 and 58. Likewise transistors 60 and 62 provide a current mirror as do transistors 66 and 67.

The voltage on the anode is such to cause a current i1/k which mirrored by the second and third transistors 56. The fourth PMOS transistor and the first PMOS transistor of the comparator are in a mirrored arrangement and are configured to scale the current by a factor of k to give a current of i1.

The voltage on the cathode is such to cause a current i2/k which mirrored by the transistors 64 and 66. The transistor 66 and the second transistor of the comparator are in a mirrored arrangement and are configured to scale the current by a factor of k to give a current of i2.

In some embodiments, the voltage to current converters and comparator are selected so as to minimise the amount of current drawn by the arrangement. In particular, the arrangement is such that i1/k and i2/k are relatively small currents. The smaller that i1/k and i2/k are, the less the amount of power which is consumed.

The use of current mirrors allow a low current i1/k and i2/k in respective V-I converters. The arrangement is such that the current in the output branch of the comparator can be scaled for a faster detection and switching. Since the current in the output leg is a dynamic current, it is possible to keep the dc current consumption (in this case i2/k) very low and still have a faster switching of the output by multiplying the current in the comparator (transistors 58 and 67) by a factor k where k is any integer, preferably, but not necessarily greater than 1.

With the arrangement of FIG. 5, the anodes and cathodes are sensed using the V-I converters 22 and 24. The transistor 64 in the voltage to current converter 22 generates a current proportional to the gate to source voltage (VGS2) across it, i.e. i2/k=gm2×VGS2, where gm is the transconductance of the transistor. Hence it is possible to size the transistor according to the requirement to control the gm2 and hence control i2/k. In similar way i1/k=gm1×VGS1 where VGS1 is gate to source voltage across transistor 50. The sizing of transistors 50 and 64 may be application dependent and dependent on what current is sufficient enough to flag the error.

The basic principle in this embodiment, is to make sure i2 is always present whereas i1 is normally off and i1 kicks in only when the diode is conducting current through it.

The comparator provided by the two transistors 58 and 67 which are both current sources fighting with each other. When i1>i2 transistor 67 is incapable of sinking the extra current and hence the node 69 is pulled up to the supply and output of the buffer is high (Logic 1). When i1<i2 device 58 is off and hence the node 69 is pulled low to ground potential and output of the buffer 18 is low (Logic 0). The dc current that is scaled and on is i2/k. Even though transistor 67 is on there is no current through transistor 67 as transistor 58 is off. Transistor 58 conducts only when the node A rises to higher voltage between time t2 and t3 in FIG. 6.

The cathode voltage at node K is reasonably constant and is at a low level, regardless of whether the laser diode is on. The input transistor 64 is configured to have a relatively high impedance such that the low voltage input to the gate of transistor 64 generates a relatively small value for i2/k. As transistor 64 is on, this causes transistors 60 and 62 to be on and to mirror the current i2/k. As transistor 62 is on, this causes transistor 66 and 67 to be on, mirroring and scaling the current i2.

In practice, i2 will be slightly lower when the laser diode is on as the voltage of the cathode rises slightly as compared to when the laser diode is off.

When the laser diode is off, the anode voltage is at a relatively low voltage causing the transistor 50 to be substantially off. This means that i1/k is very small or zero, typically very small. Transistors 54 and 56 are substantially off, mirroring the value of i1/k. Transistors 52 and 58 are also substantially off. The values of the transistors are such that i2 will be greater than i1 so the node 69 will be low.

When the laser diode is on, the anode voltage is at a relatively high voltage causing the transistor 50 to be on. This means that i1/k is relatively high. Transistors 54 and 56 are on, mirroring the value of i1/k. Transistors 52 and 58 are also on. The values of the transistors are such that i1 will be greater than i2 so the node 69 will be high.

It is also noted herein that while the above describes example embodiments, there are several variations and modifications which may be made to the disclosed approach without departing from the scope of the present invention.

Embodiments have been described as using VCSEL devices. It should be appreciated that this is by way of example only. For example, any other suitable laser diode may be used. It should be appreciated that embodiments are not limited to the use of laser diodes. For example, embodiments may be used with any other suitable device such as devices with associated drive circuits. One example is a LED (light emitting diode) with LED driver. In some embodiments, such as the LED embodiment, the safety issue may be less relevant or even irrelevant. However embodiments can be used to monitor the state of a terminal of a LED and determine whether the LED is stuck high in same way.

Alternative embodiments may be used any two port circuit/device where dynamic monitoring of the ports may be needed/desired with minimal current consumption and relatively low silicon area.

Some embodiments may have the advantage that the monitoring arrangement does not load the ports to which it is connected and does not draw any current from the ports it is sensing.

In the case of laser diodes, reference has been made to cathodes and anodes. It should be appreciated that in the case of other devices, voltages at nodes on either side of the device may be sensed to provide the proportional current.

In some embodiments, the device may be any device with in use is switched on for a relatively short period of time and if the device is left on for too long may cause a problem or cause unnecessary power to be consumed.

In the above described embodiments, examples of particular polarities of transistor are given. It should be appreciated that in embodiments, different polarities of one or more transistors may alternatively be used.

In the above described embodiments, MOS transistors are used. It should be appreciated that in other embodiments, one or more other types of transistor may be used, alternatively or additionally.

In the above described embodiments, reference is made to a voltage supply and ground. It should be appreciated that this is by way of example only. In other embodiments, different voltages may be used to provide the relatively high voltage and the relatively low voltage.

It should be appreciated that the circuits shown in the Figures are only one way in which embodiments may be provided. In other embodiments, different circuit arrangements may be provided.

Figure 8:
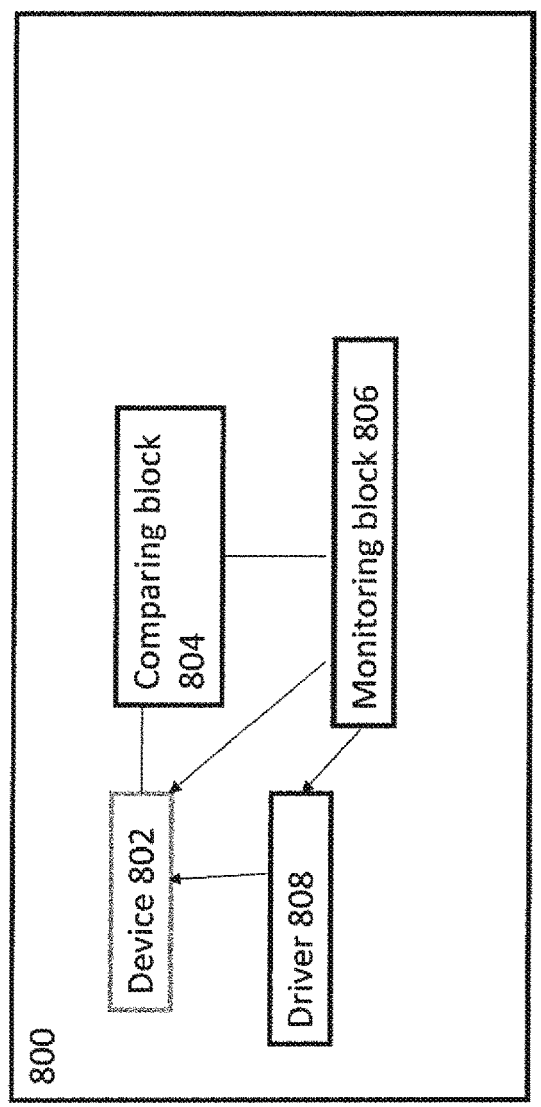
FIG. 8 shows an apparatus of some embodiments.

Reference is made by way of example only to FIG. 8 which shows an arrangement or apparatus 800. The apparatus has a device 802 (e.g. a laser diode, LED or the like). Optionally the device is driven by a driver 808. A comparing block 804 is configured to monitor the state of the device, for example to determine if the device is on. The comparing block 804 is configured to provide an output to the monitoring block 806 which is configured to determine if the device is on for a longer period than it should be on. If so the monitoring block 806 will provide an output to one or both of the driver 808 and the device 802 itself to cause the device to be switched off.

It should be appreciated that the arrangement of FIG. 8 may be modified to include one or more of the features or circuitry of the previously described embodiments.

It should be appreciated that the embodiments may be incorporated in any suitable product. By way of example only and without limitation, that product may be a mobile telephone, smart phone, tablet, computer, camera or the like.

Various embodiments with different variations have been described above. It should be noted that those skilled in the art may combine various elements of these various embodiments and variations. Such alterations, modifications, and improvements are intended to be part of this disclosure, and are intended to be within the scope of the present invention. Accordingly, the foregoing description is by way of example only and is not intended to be limiting. The present invention is limited only as defined in the following claims and the equivalents thereto.

What is claimed is:

1. A ranging device, comprising:
    a laser diode configured to emit a pulse of light;
    a detector configured to detect a reflection of the pulse of light off an object;
    a distance determination circuit configured to determine, in response to an output of the detector, a distance between the object and the ranging device;
    a comparator configured to be responsive to a first current indicative of a first voltage at a first node of the laser diode and a second current indicative of a second voltage at a second node of the laser diode, the comparator being further configured to generate an indication signal indicating that the laser diode is switched on; and
    a monitoring circuit having an input coupled to an output of the comparator, the monitoring circuit being configured to receive the indication signal and to generate a control signal in response to the indication signal being received for greater than a threshold period of time, the control signal being configured to cause the laser diode to switch off.

2. The ranging device of claim 1, wherein the comparator is further configured to provide a different output when the laser diode is switched off.

3. The ranging device of claim 1, further comprising:
    a first voltage-to-current circuit configured to provide the first current dependent on the first voltage, an output of the first voltage-to-current circuit being coupled to a first input of the comparator; and
    a second voltage-to-current circuit configured to provide the second current dependent on the second voltage, an output of the second voltage-to-current circuit being coupled to a second input of the comparator.

4. The ranging device of claim 3, wherein the second current is unchanged when the laser diode is switched on and when the laser diode is switched off.

5. The ranging device of claim 3, wherein the first current is substantially off when the laser diode is switched off and on when the laser diode is switched on.

6. The ranging device of claim 1, further comprising a clamp switch coupled between the first node and the second node of the laser diode, wherein, in response to the indication signal being received for greater than a threshold period of time, the control signal is configured to close the clamp switch to cause the laser diode to switch off.

7. The ranging device of claim 1, wherein the first node and the second node of the laser diode comprise an anode and a cathode of the laser diode, respectively.

8. A ranging device, comprising:
    a driver circuit;
    a laser diode configured to emit a photon and to be switched on and off by the driver circuit;
    a detector configured to receive a reflection of the photon off an object;
    a distance determination circuit configured to determine, in response to an output of the detector, a distance between the object and the laser diode;
    a first voltage-to-current circuit configured to provide a first current dependent on a voltage at a first node of the laser diode;
    a second voltage-to-current circuit configured to provide a second current dependent on a voltage at a second node of the laser diode;
    a comparator configured to be responsive to the first current and the second current and to generate a first output when the laser diode is switched on; and
    a monitoring circuit having an input coupled to an output of the comparator, the monitoring circuit being configured to receive the first output and to generate a control signal in response to the first output being received for greater than a threshold period of time, the control signal being configured to cause the driver circuit to switch off the laser diode.

9. The ranging device of claim 8, wherein the comparator comprises a first transistor configured to be responsive to the first current, a second transistor configured to be responsive to the second current and a node between the first transistor and the second transistors configured to provide the first output.

10. The ranging device of claim 9, wherein the first transistor and the second transistor are configured as current sources.

11. The ranging device of claim 9, wherein the first voltage-to-current circuit and the second voltage-to-current circuit each comprises a transistor arranged in a mirrored arrangement with the first transistor and the second transistor, respectively, such that each of the first current and the second current is upwardly scaled.

12. The ranging device of claim 8, wherein the comparator is further configured to provide a different output when the laser diode is switched off.

13. The ranging device of claim 8, further comprising:
    a first switch coupled between the first node of the laser diode and a supply voltage; and
    a second switch coupled in parallel to the laser diode, a first terminal of the second switch coupled to the first node of the laser diode, a second terminal of the second switch coupled to a second node of the laser diode, the second node of the laser diode being coupled to a ground potential, the control signal being configured to open the first switch or close the second switch to cause the laser diode to switch off.

14. The ranging device of claim 13, wherein the second switch comprises a clamp switch.

15. The ranging device of claim 13, wherein the driver circuit is coupled to the first switch and configured to open and close the first switch in order to switch off and switch on the laser diode, respectively.

16. The ranging device of claim 8, wherein the first node and the second node of the laser diode comprise an anode and a cathode of the laser diode, respectively.

17. The ranging device of claim 8, wherein the laser diode comprises a vertical-cavity surface-emitting laser diode.

* * * * *